US010313787B2

(12) United States Patent
Risbo et al.

(10) Patent No.: US 10,313,787 B2
(45) Date of Patent: Jun. 4, 2019

(54) ELECTROMECHANICAL SYSTEM WITH PREDICTIVE BACK-EMF PROTECTION

(71) Applicant: Texas Instruments Incorporated, Dallas, TX (US)

(72) Inventors: Lars Risbo, Hvalsoe (DK); Anker Bjørn-Josefsen, Hellerup (DK); Kim N. Madsen, Skovlunde (DK)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/827,265

(22) Filed: Aug. 14, 2015

(65) Prior Publication Data

US 2016/0057533 A1 Feb. 25, 2016

Related U.S. Application Data

(60) Provisional application No. 62/037,426, filed on Aug. 14, 2014.

(51) Int. Cl.
*H03G 11/00* (2006.01)
*H04R 3/00* (2006.01)
*H04R 29/00* (2006.01)

(52) U.S. Cl.
CPC ............... *H04R 3/007* (2013.01); *H04R 3/00* (2013.01); *H04R 29/001* (2013.01); *H04R 2203/00* (2013.01)

(58) Field of Classification Search
CPC .......... H04R 3/00; H04R 33/007; H04R 9/06; H04R 29/001; H04R 2203/00; H04R 3/007
See application file for complete search history.

(56) References Cited

U.S. PATENT DOCUMENTS

2003/0118193 A1* 6/2003 Leske ................. H04R 29/003 381/59
2015/0189427 A1* 7/2015 Tsai ...................... H04R 3/007 381/190

* cited by examiner

*Primary Examiner* — Andrew L Sniezek
(74) *Attorney, Agent, or Firm* — Andrew Viger; Charles A. Brill; Frank D. Cimino

(57) ABSTRACT

A predictive back-emf protection methodology for an electromechanical system, including a signal processor that processes a source signal to provide a modified source signal, a driver that converts the modified source signal to a drive signal, and an electromechanical transducer that generates, from the drive signal, a transducer response, and a back-emf signal coupled back to the driver output. A predictive back-emf generator (such as a routine in the signal processor) is characterized by a back-emf transfer function (linear parameterized model of the electromechanical transducer) for transforming an input signal into a transform back-emf representation of a back-emf signal predicted by the back-emf transfer function as a response of the electromechanical transducer to such input signal. The signal processor processes the source signal based on the transform back-emf representation to generate the modified source signal input to the driver. An example application is limiting peaking current in an audio system.

18 Claims, 1 Drawing Sheet

ELECTROMECHANICAL SYSTEM WITH PREDICTIVE BACK-EMF PROTECTION

CROSS-REFERENCE TO RELATED APPLICATIONS

Priority is claimed under 37 CFR 1.78 and 35 USC 119(e) to U.S. Provisional Application 62/037,426, filed 14 Aug. 2014, which is incorporated by reference.

BACKGROUND

Technical Field

This Patent Disclosure relates generally to electromechanical systems that generate back-emf, and more particularly to providing protection from back-emf for such systems.

Related Art

A Speaker is an electromechanical system that is capable of storing energy in reactive electrical components, as well as in mechanical components like moving masses and compressed springs.

The amplifier drives current to the speaker coil (and passive electrical components in the speaker). Mechanical energy stored in the speaker coil and other mechanical components is transformed back into a current that travels back to the amplifier.

The magnitude of the back-EMF current can be large compared to driven current. As a result, the total current at the amplifier output can trigger overcurrent protection in situations where only the driven current would not.

One approach for protecting against back-emf current is to overdesign the amplifier to handle worst case current. This solution disadvantageous particularly because the worst case current is sporadic and seldom (based on combinations of audio and speaker).

While this Background information references audio speaker systems, the Disclosure in this Patent Document is not limited to such applications, but is more generally directed to predictive back-emf protection for electromechanical systems.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for predictive back-emf protection adaptable to electromechanical systems, such as providing predictive back-emf protection for an audio speaker system to limit peaking current.

According to aspects of the Disclosure, an electromechanical system that generates back-emf (electro-motive force) can include a signal source to provide a source signal, a signal driver receiving an input signal based on a modified source signal, and generating a drive signal, and an electromechanical transducer coupled to receive the drive signal, and to generate a transducer output response, and a back-emf signal response. The signal driver can include a signal processing module to receive the source signal, and to generate the modified source signal, and an amplifier to receive the modified source signal, and to generate the drive signal, the amplifier having a pre-defined output peak current limit. The signal processing module can include a predictive back-emf generator, and a peak current limit control loop including the predictive back-emf generator to generate the modified source signal based on; the source signal, and a feedback predictive back-emf signal, and a peak current reference corresponding to the pre-defined output peak current limit. The predictive back-emf generator can be configured to generate the predictive back-emf signal based on a pre-defined back-emf transfer function as a representation of the back-emf response of the electromechanical transducer to the modified source signal.

According to other aspects of the Disclosure, a signal driver circuit is configured for use in a system with a signal source to generate a source signal. and an electromechanical transducer to generate, in response to a drive signal based on the source signal, a transducer output response, and a back-emf signal response. The signal driver circuit can include an signal processing module to receive the source signal, and to generate the modified source signal, and an amplifier to receive the modified source signal, and to generate the drive signal, the amplifier having a pre-defined output peak current limit. The signal processing module can include a predictive back-emf generator, and a peak current limit control loop including the predictive back-emf generator to generate the modified source signal based on: the source signal, and a feedback predictive back-emf signal, and a peak current reference corresponding to the pre-defined output peak current limit. The predictive back-emf generator can be configured to generate the predictive back-emf signal based on a pre-defined back-emf transfer function as a representation of the back-emf response of the electromechanical transducer to the modified source signal.

According to Other aspects pf the Disclosure, a signal processor is operable for use in a system with a signal source to generate a source signal, a signal driver including an amplifier to generate a drive signal based on the source signal, and an electromechanical transducer to generate, in response to the drive signal, a transducer output response, and a back-emf signal response. The signal processor can include a predictive back-emf generator, and a peak current limit control loop including the predictive back-emf generator to generate the modified source signal based on: the source signal, and a feedback predictive back-emf signal, and a peak current reference corresponding to the pre-defined output peak current limit. The predictive back-emf generator can be configured to generate the predictive back-emf signal based on a pre-defined back-emf transfer function as a representation of the back-emf response of the electromechanical transducer to the modified source signal.

Other aspects and features of the invention claimed in this Patent Document will be apparent to those skilled in the art from the following Disclosure.

DETAILED DESCRIPTION

This Description and the Drawings constitute a Disclosure for predictive back-emf protection in an electromechanical system, including example embodiments that illustrate various technical features and advantages.

This Disclosure is in the context of an example application of adapting predictive back-emf protection to an audio speaker system.

In brief overview, a predictive back-emf protection methodology is adaptable to electromechanical systems. A signal processor processes a source signal to provide a modified source signal. A driver converts the modified source signal to a drive signal, converted by an electromechanical transducer into a transducer response, including generating a resulting back-emf signal coupled back to the driver output. A predictive back-emf generator (such as a routine in the signal processor) is characterized by a back-emf transfer function (such as a linear parameterized model of the electromechanical transducer) for transforming an input signal into a transform back-emf representation of a back-emf signal predicted by the back-emf transfer function as a response of the electromechanical transducer to the modified source signal. The signal processor processes the source signal based on the transform back-emf representation to generate the modified source signal input to the driver.

Figure 1:
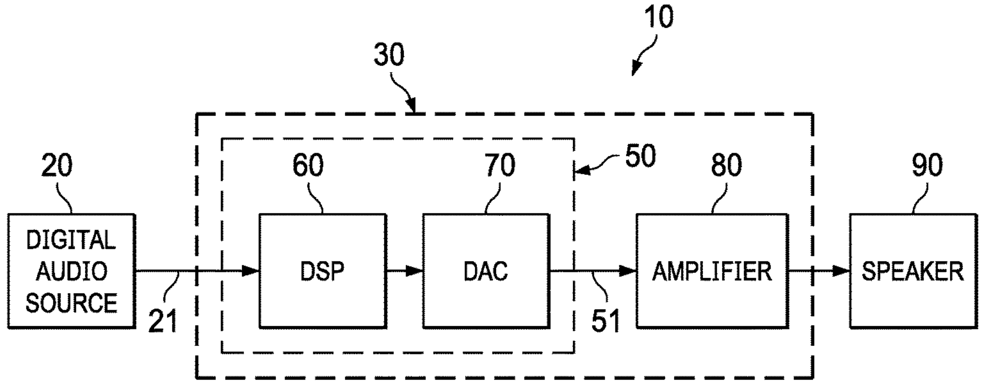
FIG. 1 illustrates an example audio system 10 with digital audio input 20, 21, including a signal driver 30 with an audio processor 50, implemented with a DSP 60 and DAC 70, and with a voltage amplifier 80 driving a speaker 90, such as can adapted to use predictive back-emf protection according to this Disclosure.

FIG. 1 illustrates an example audio system 10 with digital audio input, such as can adapted to use predictive back-emf protection according to this Disclosure.

A digital audio source 20 supplies digital audio to a signal driver 30 that includes an audio processor 50, implemented in this example as a DSP (digital signal processor) 60 and DAC (digital to analog converter) 70 and an audio amplifier 80. The audio amplifier 80 drives a speaker unit 90.

The audio system 10 can be adapted to provide protection for back-emf using predictive back-emf processing according to the Disclosure. Predictive back-emf protection is based on a linear parameterized description of the speaker (and the gain in the DAC and amplifier). For the example implementation of predictive back-emf according to this Disclosure, a predictive back-emf algorithm is executed by the DSP 60. DSP predictive back-emf processing (predictive of back-emf) is used to modify the audio stream (digital audio source) processed in the DSP to limit amplifier current due to back-emf peaking.

Figure 2:
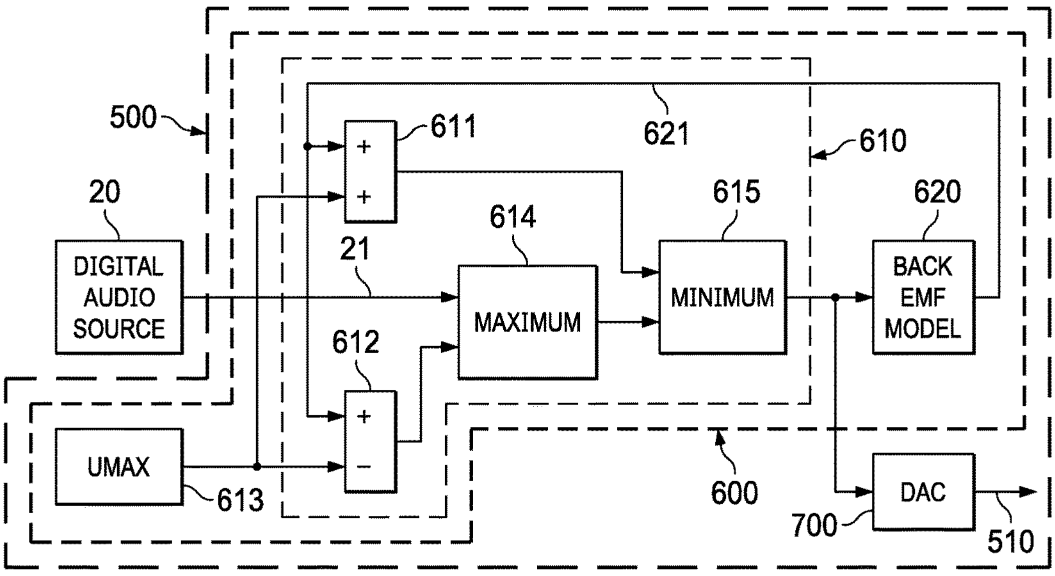
FIG. 2 illustrates an example configuration for predictive back-emf processing according to this Disclosure.

FIG. 2 illustrates an example audio processor 500, configured for predictive back-emf processing according to this Disclosure. Audio processor 500 implements a peak current limit control loop predictive back-emf processing 600 includes a peak current control loop predictive back-emf processing 600 protects against back-emf current triggering overcurrent protection in the audio amplifier (FIG 1. 80) when amplifier driven current would not.

Audio processor 500 includes a peak current limit control loop 600, including a modified source signal generator 610 and a predictive back-emf generator 620 that provides a feedback predictive back-emf signal 621.

The modified source signal generator 610 incudes additive and subtractive threshold units 611 and 612. The threshold units 611 and 612 generate peak current limit thresholds based on an amplifier peak current threshold/reference (for amplifier 80 in FIG. 1) UMAX 613, and the predictive back-emf signal 621 generated by the predictive back-emf generator 620 (as described below): additive threshold unit 611 generates an additive peak current limit threshold, and subtractive threshold unit 612 generates a subtractive peak current limit threshold.

The modified source signal generator 610 includes maximum and minimum function blocks 614 and 615 that generate the modified source signal based on the additive and subtractive peak current limit thresholds 611 and 612 and the input digital audio source signal 21. Maximum function block 614 generate a maximum function output based on the subtractive peak current limit threshold 612 and the input digital audio source signal 21. Minimum function block 615 generates a digital modified source signal 630 based on the additive peak current limit threshold 611 and the maximum function output (which is based on the input digital audio source signal 21 and the subtractive peak current limit threshold 612).

The digital modified source signal 630 generated by the modified source signal generator 610, based on the predictive back-emf signal 621 generated by the predictive back-emf generator 620, is input to a DAC 700 for conversion to an analog modified source signal 510. Modified source signal 510 is input to an audio amplifer, such as the audio amplifier 80 in FIG 1. This modified source signal 510 protects against back-emf current triggering overcurrent protection in the audio amplifier (FIG. 1, 80) when amplifier driven current would not.

The predictive back-emf generator 620 implements a back-emf model corresponding to a linear model of the back-emf that predicts the back-emf based on past speaker voltage input. The example audio system in FIG. 1 uses a voltage amplifier 80, so that the example predictive back-emf processing to provide current limit protection is described in the voltage domain. That is, the predictive back-emf signal 621 is a current, but is expressed in terms of a corresponding voltage over the speaker resistive component, and in particular, the peak current limit threshold 613 for the amplifier is expressed in terms of a voltage UMAX.

The example back-emf model implemented in the predictive back-emf model uses an example speaker transfer function model that applies for the lower part of the audio spectrum, including accounting for the current flowing into a speaker. An example speaker transfer function model can be found in J. W. Marshall Leach, Introduction to Electroacoustics & Audio Amplifier Design. Kendall/Hunt Publishing company 2003.

With this speaker transfer function model, the current into the speaker can be expressed in terms of voice coil resistance, and back-EMF:

$$i = u\left(\frac{1}{R_E} - \frac{(Bl)^2}{R_E^2}\frac{1}{j\varpi M_{MS} + R_{MT} + \frac{1}{j\varpi}C_{MS}}\right)$$

where the variables corresponds to the following physical parameters: $R_E$: voice coil resistance at DC; BI: force factor; $M_{MS}$: mechanical mass of driver diaphragm assembly; $C_{MS}$: mechanical compliance of driver suspension; $R_{MT}$: Total mechanical damping. $R_{MT}$ is given by $$R_{MT} = R_{MS} + \frac{(Bl)^2}{R_E}$$

Other speaker models can be used.

Adapting predictive back-emf protection according to this Disclosure allows amplifier design for expected-average operation. Predictive back-emf processing is then used to predict back-emf current peaking based on audio input, and modify the audio stream to compensate for such predicted back-emf current peaking.

The Disclosed predictive back-emf protection methodology is adaptable to other electromechanical system, providing protection from back-emf current peaking, such protecting batteries from current peaking.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. An electromechanical system that generates back-emf (electro-motive force), comprising
- a signal source to provide a source signal;
- a signal driver receiving an input signal based on a modified source signal, and generating a drive signal;
- an electromechanical transducer coupled to receive the drive signal, and to generate a transducer output response, and a back-emf signal response;
- the signal driver including:
  - an signal processing module to receive the source signal, and to generate the modified source signal;
  - an amplifier to receive the modified source signal, and to generate the drive signal, the amplifier having a pre-defined output peak current limit;
  - the signal processing module including:
    - a predictive back-emf generator;
    - a peak current limit control loop including the predictive back-emf generator to generate the modified source signal based on:
      - the source signal, and
      - a feedback predictive back-emf signal, and
      - a peak current reference corresponding to the pre-defined output peak current limit, and
  - the predictive back-emf generator to generate the predictive back-emf signal based on a pre-defined back-emf transfer function as a representation of the back-emf response of the electromechanical transducer to the modified source signal.

2. The system of claim 1, wherein the signal processing module including the predictive back-emf generator comprises a routine executed by a digital signal processor.

3. The system of claim 1, wherein
- the signal source is an audio signal source; and
- the electromechanical transducer is an audio speaker, where the transducer response is audio signals generated by the audio speaker.

4. The system of claim 1, wherein the back-emf transfer function is based on a linearized parameterized model of the electromechanical transducer.

5. The system of claim 1, wherein the peak current limit control loop operates in a voltage domain, with the predictive back-emf signal and the pre-defined output peak current limit corresponding to currents expressed in the voltage domain.

6. The system of claim 1, wherein based on the modified source signal, the signal driver generates the drive signal so that the amplifier does not exceed the pre-defined output peak current limit.

7. A signal driver circuit for use in a system with a signal source to generate a source signal, and an electromechanical transducer to generate, in response to a drive signal based on the source signal, a transducer output response, and a back-emf signal response, the circuit comprising:
- a signal processing module to receive the source signal, and to generate a modified source signal;
- an amplifier to receive the modified source signal, and to generate the drive signal, the amplifier having a pre-defined output peak current limit;
- the signal processing module including:
  - a predictive back-emf generator;
  - a peak current limit control loop including the predictive back-emf generator to generate the modified source signal based on:
    - the source signal, and
    - a feedback predictive back-emf signal, and
    - a peak current reference corresponding to the pre-defined output peak current limit, and
  - the predictive back-emf generator to generate the predictive back-emf signal based on a pre-defined back-emf transfer function as a representation of the back-emf response of the electromechanical transducer to the modified source signal.

8. The circuit of claim 7, wherein the signal processing module including the predictive back-emf generator comprises a routine executed by a digital signal processor.

9. The circuit of claim 7, wherein
- the signal source is an audio signal source; and
- the electromechanical transducer is an audio speaker, where the transducer response is audio signals generated by the audio speaker.

10. The system of claim 7, wherein the back-emf transfer function is based on a linearized parameterized model of the electromechanical transducer.

11. The circuit of claim 7, wherein the peak current limit control loop operates in a voltage domain, with the predictive back-emf signal and the pre-defined output peak current limit corresponding to currents expressed in the voltage domain.

12. The circuit of claim 7, wherein based on the modified source signal, the signal driver generates the drive signal so that the amplifier does not exceed the pre-defined output peak current limit.

13. A signal processor for use in a system with a signal source to generate a source signal, a signal driver including an amplifier to generate a drive signal based on the source signal, and an electromechanical transducer to generate, in response to the drive signal, a transducer output response, and a back-emf signal response, the signal processor comprising:
- a predictive back-emf generator;
- a peak current limit control loop including the predictive back-emf generator to generate the modified source signal based on:
  - the source signal, and
  - a feedback predictive back-emf signal, and
  - a peak current reference corresponding to a pre-defined output peak current limit of the amplifier;
- the predictive back-emf generator to generate the predictive back-emf signal based on a pre-defined back-emf transfer function as a representation of the back-emf response of the electromechanical transducer to a modified source signal for input to the signal driver.

14. The signal processor of claim 13, wherein the signal processor including the predictive back-emf generator comprises a routine executed by a digital signal processor.

15. The signal processor of claim 13, wherein
- the signal source is an audio signal source; and the electromechanical transducer is an audio speaker, where the transducer response is audio signals generated by the audio speaker.

16. The signal processor of claim 13, wherein the back-emf transfer function is based on a linearized parameterized model of the electromechanical transducer.

17. The signal processor of claim 13, wherein the peak current limit control loop operates in a voltage domain, with the predictive back-emf signal and the pre-defined output peak current limit corresponding to currents expressed in the voltage domain.

18. The signal processor of claim 13, wherein based on the modified source signal, the signal driver generates the drive signal so that the amplifier does not exceed the pre-defined output peak current limit.

* * * * *